(12) United States Patent
Whitener et al.

(10) Patent No.: US 11,803,120 B2
(45) Date of Patent: Oct. 31, 2023

(54) GRAPHENE-ENABLED BLOCK COPOLYMER LITHOGRAPHY TRANSFER TO ARBITRARY SURFACES

(71) Applicant: The Government of the United States of America, as represented by the Secretary of the Navy, Arlington, VA (US)

(72) Inventors: Keith E. Whitener, Alexandria, VA (US); Woo K. Lee, Vienna, VA (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 317 days.

(21) Appl. No.: 17/115,572

(22) Filed: Dec. 8, 2020

(65) Prior Publication Data

US 2021/0208501 A1 Jul. 8, 2021

Related U.S. Application Data

(60) Provisional application No. 62/958,467, filed on Jan. 8, 2020.

(51) Int. Cl.
*G03F 7/00* (2006.01)
*G03F 7/34* (2006.01)
(Continued)

(52) U.S. Cl.
CPC .......... *G03F 7/0002* (2013.01); *C01B 32/194* (2017.08); *C08J 7/08* (2013.01); *C08J 7/14* (2013.01); *G03F 7/343* (2013.01)

(58) Field of Classification Search
CPC .................................................. G03F 7/0002
See application file for complete search history.

(56) References Cited

U.S. PATENT DOCUMENTS 8,268,180 B2 9/2012 Arnold et al.
9,012,882 B2 4/2015 Duan et al.
(Continued)

OTHER PUBLICATIONS

Whitener Jr, Keith E., et al. "Transfer of chemically modified graphene with retention of functionality for surface engineering." Nano letters 16.2 (2016): 1455-1461.
(Continued)

*Primary Examiner* — Ian A Rummel
(74) *Attorney, Agent, or Firm* — US Naval Research Laboratory; Stephen T. Hunnius (57) ABSTRACT

A method of graphene-enabled block copolymer lithography transfer to an arbitrary substrate comprising the steps of applying graphene on a surface, adding block copolymers to the graphene on the surface, phase-separating the block copolymers, forming nanopatterned phase separated block copolymers, delaminating the graphene, and transferring the graphene and nanopatterned phase separated block copolymers to a second surface. A layer of nanopatterned phase separated block copolymers on an arbitrary surface comprising a first arbitrary substrate absent of chemical preparation, a layer of graphene on the first arbitrary substrate, and a layer of phase-separated block copolymers on the layer of graphene, wherein the layer of phase-separated block copolymers on the layer of graphene was formed on a second substrate and delaminated via water liftoff and wherein the nanopatterned phase separated block copolymers are utilized as a shadow mask for lithography on the first arbitrary substrate.

2 Claims, 5 Drawing Sheets

(51) Int. Cl.
*C08J 7/14* (2006.01)
*B29C 71/02* (2006.01)
*C01B 32/194* (2017.01)

(56) References Cited

U.S. PATENT DOCUMENTS

| | | |
|---|---|---|
| 9,105,480 B2 | 8/2015 | Arnold et al. |
| 9,114,998 B2 | 8/2015 | Arnold et al. |
| 9,748,108 B2 | 8/2017 | Jeong et al. |
| 9,895,870 B2 | 2/2018 | Whitener et al. |
| 9,927,706 B2 | 3/2018 | Nealey et al. |
| 9,929,238 B2 | 3/2018 | Jeong et al. |
| 2017/0062229 A1* | 3/2017 | Nealey .................. B82Y 40/00 |
| 2017/0259554 A1* | 9/2017 | Whitener ................ H01J 37/26 |

OTHER PUBLICATIONS

Chang, Tzu-Hsuan, et al. "Directed self-assembly of block copolymer films on atomically-thin graphene chemical patterns." Scientific reports 6.1 (2016): 1-9.

Hong, Augustin J., et al. "Metal nanodot memory by self-assembled block copolymer lift-off." Nano letters 10.1 (2010): 224-229.

Katsumata, Reika, et al. "Large area fabrication of graphene nanoribbons by wetting transparency-assisted block copolymer lithography." Polymer 110 (2017): 131-138.

Lee, Woo-Kyung, et al. "Transferring electronic devices with hydrogenated graphene." Advanced Materials Interfaces 6.10 (2019): 1801974.

* cited by examiner

GRAPHENE-ENABLED BLOCK COPOLYMER LITHOGRAPHY TRANSFER TO ARBITRARY SURFACES

REFERENCE TO RELATED APPLICATION

This application is a non-provisional of, and claims priority to and the benefits of, U.S. Provisional Patent Application No. 62/958,467 filed on Jan. 8, 2020, the entirety of which is herein incorporated by reference.

BACKGROUND

This disclosure concerns a novel method to use graphene-based materials as transfer layers for block copolymer lithography.

Chemically modified graphene is prepared on a surface, and block copolymers are added to this surface, and phase separated to form nanopatterns. The graphene, which is weakly adherent to the surface, is then delaminated via water lift-off and physically transferred to a new "target" substrate.

The transfer maintains or does not disturb the nanopatterned phase separation of the block copolymers, which can then be used as a shadow mask for lithography on the new target substrate.

The target substrate does not need to undergo any of the surface chemical preparation typical of standard block copolymer lithography.

This eliminates the need for specific predetermined knowledge of surface chemistry and robustness to chemical or thermal exposure required in typical block copolymer annealing.

Our method therefore allows use of block copolymer lithography on arbitrary substrates.

Block copolymers (BCPs) are polymers consisting of more than one monomer unit such that the sequence of monomers is a long chain of one monomer followed by a long chain of another monomer. For instance, one common BCP used in the work below, polystyrene-block-poly (methyl methacrylate) (PS-b-PMMA), consists of blocks of ~200 styrene monomers connected with blocks of ~100 methyl methacrylate monomers.

BCPs have a unique ability to phase-separate at the nanoscale. Using the PS-b-PMMA example, if a thin film of this BCP on a substrate is immersed in acetic acid vapor, the PMMA blocks are well solvated, whereas the PS blocks are not. The blocks separate into phases, like a mixture of oil and water separating, but since the physical size of the blocks is nanoscale and the blocks are covalently bonded together, the phase-separated BCPs exhibit nanoscale patterns, on the order of 10-100 nm.

This nanoscale phase separation has garnered interest because of its potential use in micro- and nano-fabrication. Under certain etching conditions, one block of the BCP etches more rapidly than the other. For example, in a reactive oxygen plasma, the PMMA block will etch faster than the PS block. This will expose the substrate under the PMMA block of the BCP thin film preferentially. Subsequent application of an etchant specific to the substrate will make contact with the substrate only in the areas where PMMA has been removed, and not where PS still remains. Thus, the phase-separated BCP acts as a lithographic mask, and this technique is called block copolymer lithography.

Prior art methods, to induce block copolymer phase separation, require a surface needs to be specially chemically prepared by grafting specific chemical functionalities or a random copolymer brush directly onto the surface. A thin BCP layer is then spin-coated onto the modified surface and the phase separation is effected using either heat (>150° C.) or a solvent annealing process.

These requirements, of the prior art, limit the types of surfaces that can be modified by BCP lithography: the surfaces must be heat-stable and resistant to the particular solvents used in the anneal. Moreover, to add the necessary chemical functionalities to the surface, the specific surface chemical behavior must be known in advance, with the prior art methods.

These prior art limitations can require significant investments of time and money into surface chemical research efforts.

Our invention presented here removes the need for this surface chemical research investment. We disclose herein a new method, to avoid the problems of the prior art, by preparing a phase-separated BCP on functionalized graphene, a material which can be easily transferred to arbitrary surfaces via a simple water lift-off delamination.

Our transfer process preserves the BCP phase separation and is surface-agnostic. In addition, the graphene material is heat-stable, solvent-stable, and robust to most lithography processing steps, so that the graphene can be micropatterned to direct BCP phase separation before the transfer to a potentially fragile substrate.

SUMMARY OF DISCLOSURE

Description

This disclosure teaches a method and the product using graphene-based materials as transfer layers for block copolymer lithography.

Chemically modified graphene is prepared on a surface, and block copolymers are added to this surface, and phase separated to form nanopatterns. The graphene, which is weakly adherent to the surface, is then delaminated via water lift-off and physically transferred to a new "target" substrate.

The transfer maintains or does not disturb the nanopatterned phase separation of the block copolymers, which can then be used as a shadow mask for lithography on the new target substrate.

The target substrate does not need to undergo any of the surface chemical preparation typical of standard block copolymer lithography.

This eliminates the need for specific predetermined knowledge of surface chemistry and robustness to chemical or thermal exposure required in typical block copolymer annealing.

Our method therefore allows use of block copolymer lithography on arbitrary substrates.

Advantages and new features are provided herein with our method. For example, phase-separated BCPs can be transferred onto arbitrary substrates using water lift-off without having to specially prepare the substrate with chemical or polymer brush functionalities beforehand. The elimination of special substrate preparation both simplifies BCP lithography, and reduces the need to determine surface-specific chemical and physical properties for each new surface that is introduced into the BCP lithography process.

Another example of an advantage is the graphene material used as the transfer layer is robust to many chemical and physical processes, including many lithographic processes used in semiconductor device microfabrication. Thus, standard lithography and BCP can be used on the same graphene transfer layer, which is then transferred to a new substrate.

Furthermore, since the BCP annealing is performed on the graphene transfer layer, the target substrate is only ever exposed to water. Thus, target substrates which are sensitive to BCP annealing conditions (high temperatures, acid/solvent exposure) can be used with this technique.

Also, the graphene material can be patterned with its own functionalities using standard organic methods to spatially direct phase separation of the BCPs.

DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings.

DETAILED DESCRIPTION OF THE INVENTION

This invention teaches a method and the product using graphene-based materials as transfer layers for block copolymer lithography.

Chemically modified graphene is prepared on a surface, and block copolymers are added to this surface, and phase separated to form nanopatterns. The graphene, which is weakly adherent to the surface, is then delaminated via water lift-off and physically transferred to a new "target" substrate.

The transfer maintains does not disturb the nanopatterned phase separation of the block copolymers, which can then be used as a shadow mask for lithography on the new target substrate.

The target substrate is absent chemical preparation or does not need to undergo any of the surface chemical preparation typical of standard block copolymer lithography.

This eliminates the need for specific predetermined knowledge of surface chemistry and robustness to chemical or thermal exposure required in typical block copolymer annealing.

Our method therefore allows use of block copolymer lithography on arbitrary substrates.

Advantages and new features are provided herein with our method. For example, phase-separated BCPs can be transferred onto arbitrary substrates using water lift-off without having to specially prepare the substrate with chemical or polymer brush functionalities beforehand.

The elimination of special substrate preparation both simplifies BCP lithography, and reduces the need to determine surface-specific chemical and physical properties for each new surface that is introduced into the BCP lithography process.

Another example of an advantage is the graphene material used as the transfer layer is robust to many chemical and physical processes, including many lithographic processes used in semiconductor device microfabrication. Thus, standard lithography and BCP can be used on the same graphene transfer layer, which is then transferred to a new substrate.

Furthermore, since the BCP annealing is performed on the graphene transfer layer, the target substrate is only ever exposed to water. Thus, target substrates which are sensitive to BCP annealing conditions (high temperatures, acid/solvent exposure) can be used with this technique.

Also, the graphene material can be patterned with its own functionalities using standard organic methods to spatially direct phase separation of the BCPs.

Example 1

Once the BCP has been transferred onto this arbitrary target surface, BCP lithography can be performed as it would on a conventionally prepared surface.

Figure 5:
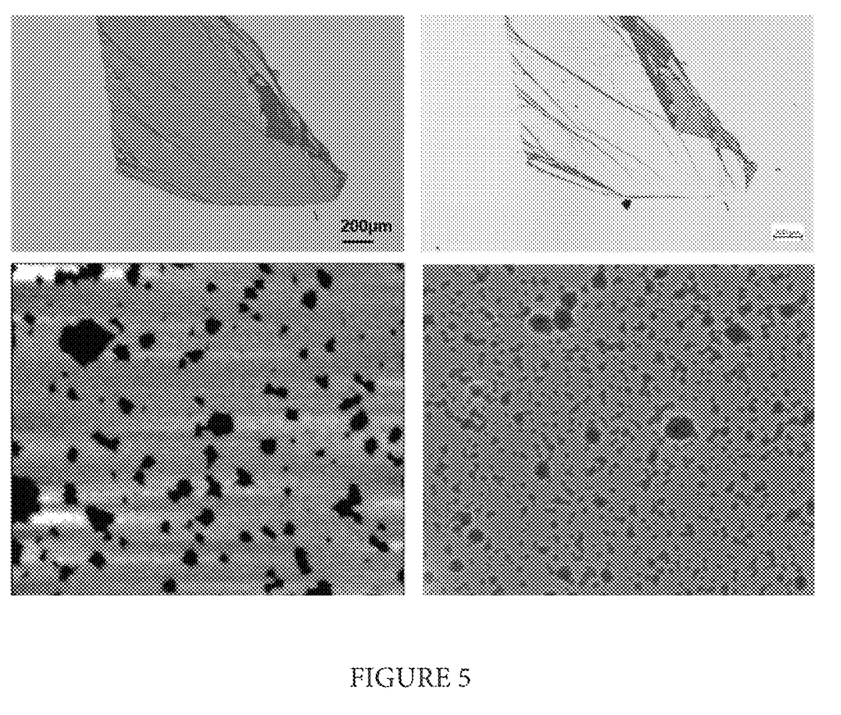
FIG. 5 illustrates an optical microscope image of BCP-HG relaminated onto HF-treated silicon substrate. Also illustrated is an optical microscope image of the sample after the following processes: 320 nm UV exposure for 10 min, and oxygen plasma etch of BCP for 3 min to remove PMMA blocks. AFM topography image illustrated from inside the film region after the following processes: Xenon difluoride ($XeF_2$) gas exposure for 2 min to etch silicon holes in the spots of removed PMMA blocks, and sonication of the sample in acetone followed by brief oxygen plasma etch to completely remove remaining BCP-HG film. The measured depth of dark regions was 4-5 nm. Also illustrated is a scanning electron microscope (SEM) image of the region from inside the film.

FIG. 5 shows such a lithography experiment, where phase-separated BCP has been transferred to HF-treated silicon.

Oxygen plasma was used to etch PMMA blocks from the BCP, leaving the silicon underneath the PMMA blocks exposed. The wafer was then treated with xenon difluoride to etch the exposed silicon, leaving pits in the silicon where the PMMA blocks were originally and smooth silicon where the PS blocks were, as shown in FIG. 5.

Illustrated in FIG. 5 is an optical microscope image of the sample after the following processes: 320 nm UV exposure for 10 min, and oxygen plasma etch of BCP for 3 min to remove PMMA blocks. AFM topography image illustrated from inside the film region after the following processes: Xenon difluoride ($XeF_2$) gas exposure for 2 min to etch silicon holes in the spots of removed PMMA blocks, and sonication of the sample in acetone followed by brief oxygen plasma etch to completely remove remaining BCP-HG film. The measured depth of dark regions was 4-5 nm. Also illustrated is a scanning electron microscope (SEM) image of the region from inside the film.

Example 2

Figure 1:
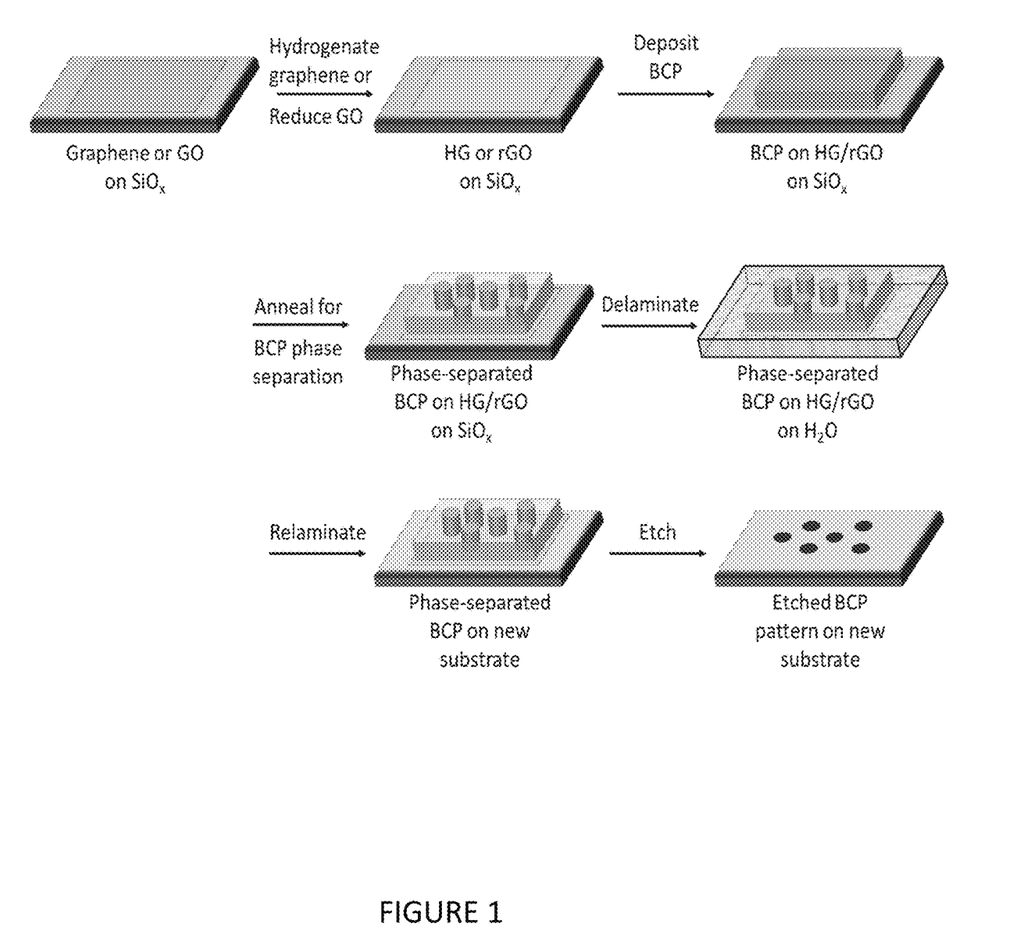
FIG. 1 illustrates a schematic of workflow for the novel method presented in this disclosure.

This invention consists of the preparation of a graphene transfer layer with a phase-separated BCP overlayer and the water lift-off transfer of the phase-separated BCP to an arbitrary surface while maintaining phase separation, as shown in FIG. 1.

Example 3

The graphene transfer layer was prepared on a robust substrate such as $SiO_x/Si$ or glass. Several different types of graphene transfer layer were used, including: 1) a hydrogenated single layer of graphene prepared by transferring CVD-grown graphene on copper to a clean $SiO_x/Si$ substrate, and 2) a layer of thermally or chemically reduced graphene oxide spin-cast or drop-cast onto glass.

Both hydrogenated graphene and graphene oxide can undergo further chemical modifications if desired while maintaining the critical lift-off ability that makes this transfer possible.

Example 4

Typical procedures for each of these transfer layer preparations are as follows.

For hydrogenated graphene: Single layer graphene was grown via chemical vapor deposition and transferred onto silicon/silicon oxide wafers using a standard polymer-supported copper etching process.

The graphene was then hydrogenated via the Birch reduction, a dissolving metal hydrogenation. This reaction has been shown to weaken the adhesion of graphene to its substrate and allow the transfer of chemical functionality from one substrate to another.

Example 5

For graphene oxide: Graphene oxide was prepared from graphite via the Hummers method. A suspension of 8 g/L of graphite oxide in water was diluted by 50% (v/v) with methanol and spin-coated at 900-3000 rpm or drop-cast onto a hydrophilic plasma-cleaned glass surface.

The graphene oxide was then either thermally or chemically reduced. Thermal reduction consisted of heating the graphene oxide to 250° C. in air for 30 seconds. Chemical reduction consisted of exposing the graphene oxide to hydrazine vapor in a small chamber for 15 minutes.

Example 6

A solution of the chosen BCP was then spun onto the graphene transfer layers, and the BCP is annealed to effect nanoscale phase separation.

A representative procedure is as follows.

Figure 2:
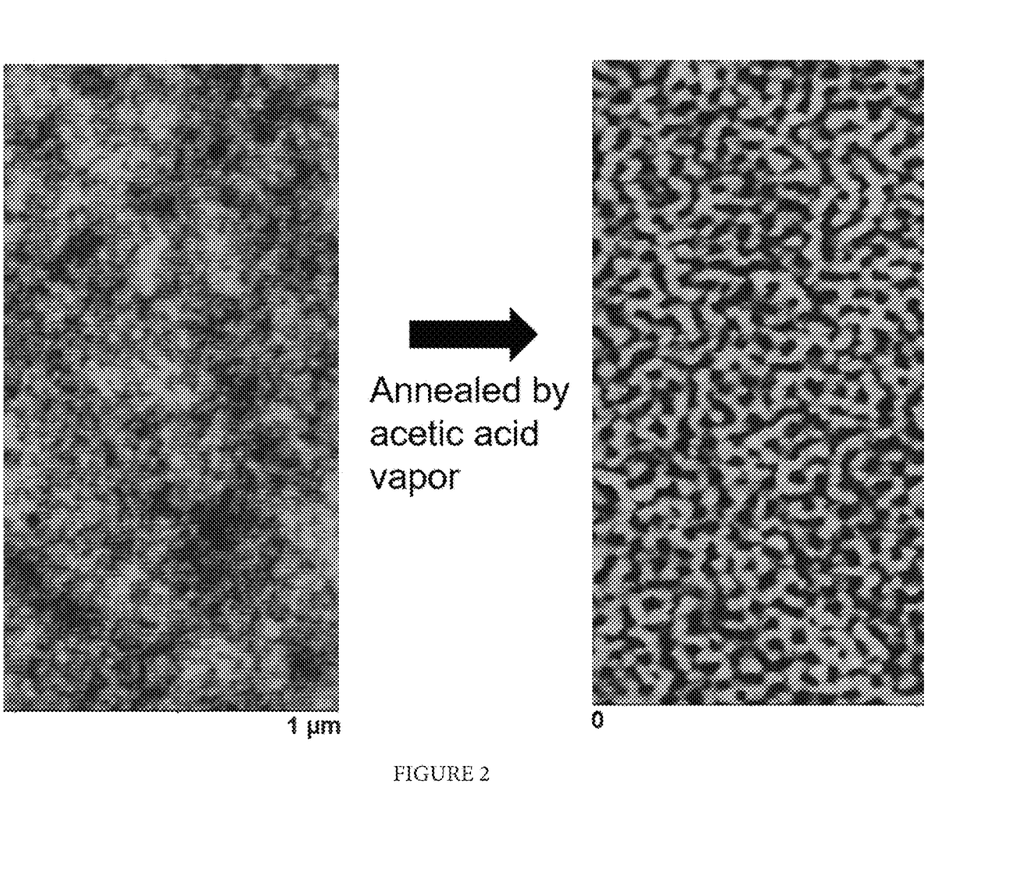
FIG. 2 illustrates atomic force microscopy (AFM) topography images of PS-b-PMMA BCP film before anneal (as spun) and after acetic acid vapor anneal. The image after acetic acid vapor anneal shows phase separation—the bright regions are PS and the dark regions are PMMA.

A solution of PS-b-PMMA in toluene was spun onto the graphene transfer layer at 4000 rpm for 1 minute. This yields a BCP layer with thickness approximately 35 nm. The BCP/graphene was then annealed in acetic acid vapor for 3 hours, which phase separated the PS and PMMA blocks into an array of dots, as shown in FIG. 2.

The BCP/graphene was then delaminated from its substrate by immersing it slowly in water. This layered structure was then retrieved onto arbitrary substrates.

Figure 3:
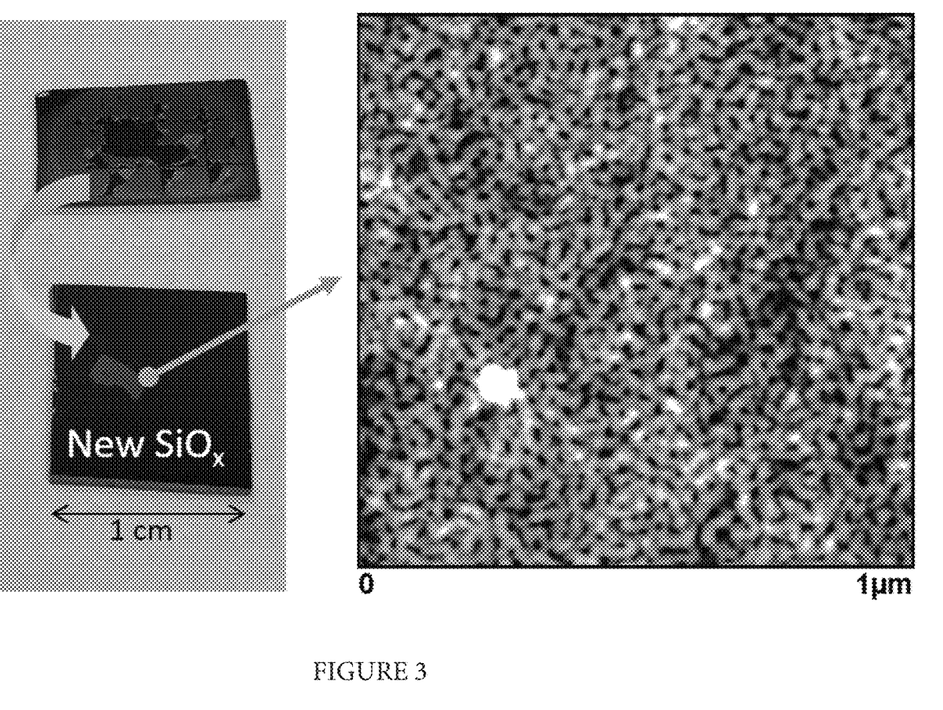
FIG. 3 illustrates BCP-HG film which was delaminated in water and then subsequently relaminated onto a new $SiO_x$ substrate in water. To facilitate delamination, we scribed film with a razor blade before the transfer process. Also illustrated is an AFM topographic image of surface morphology of the BCP film relaminated onto a new $SiO_x$ substrate. The image shows that the BCP film on HG retains the phase separation during the transfer process.
Figure 4:
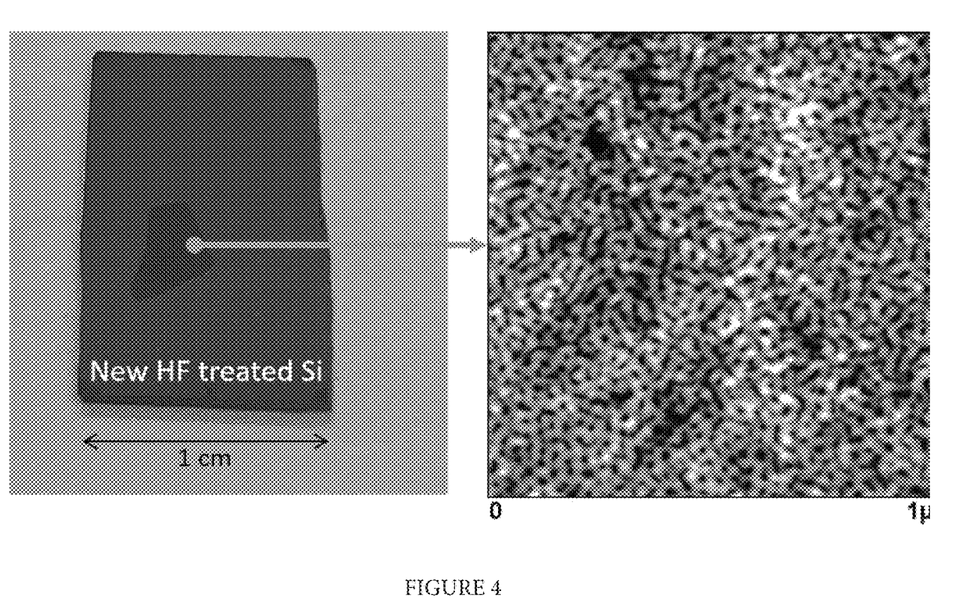
FIG. 4 illustrates BCP-HG film which we relaminated onto a new silicon substrate treated with hydrofluoric acid to remove silicon oxides. Also illustrated is the topography of the film imaged by AFM showing that the phase separation remains after the transfer process.

It was found that the BCP phase separation pattern is preserved during this transfer onto silicon oxide, as shown in FIG. 3, and hydrofluoric acid treated silicon, as shown in FIG. 4.

Our approach provides many advantages and new features. Some examples are as follows.

Phase-separated BCPs can be transferred onto arbitrary substrates using water lift-off without having to specially prepare the substrate with chemical or polymer brush functionalities beforehand.

The elimination of special substrate preparation both simplifies BCP lithography and reduces the need to determine surface-specific chemical and physical properties for each new surface that is introduced into the BCP lithography process.

The graphene material used as the transfer layer is robust to many chemical and physical processes, including many lithographic processes used in semiconductor device microfabrication. Thus, standard lithography and BCP can be used on the same graphene transfer layer, which is then transferred to a new substrate.

Since the BCP annealing is performed on the graphene transfer layer, the target substrate is only ever exposed to water. Thus, target substrates which are sensitive to BCP annealing conditions (high temperatures, acid/solvent exposure) can be used with this technique.

Also, the graphene material can be patterned with its own functionalities using standard organic methods to spatially direct phase separation of the BCPs.

On many surfaces, patterning and phase separating block copolymers currently requires that a random phase copolymer be grafted onto the surface of interest. This grafting reaction generally requires knowledge of the chemical identity and structure of the surface as well as potential reaction pathways for generating the desired functionality. Often a pre-patterning step is also desirable to generate new lithographic patterns. This pre-patterning can also involve grafting reactions, which further increases the complexity of the process.

In contrast, our method sidesteps the problem of specific surface chemistry by 1) expressing the desired patterns on a hydrogenated graphene layer, and 2) transferring that layer to the surface of interest. As the transfer of the BCP-bearing graphene is largely independent of the specific chemical structure and reactivity of the surface of interest, the problem of identifying promising reaction pathways for each individual surface is obviated.

Also, other methods exist for obtaining phase-separated block copolymers on graphene and graphene-like carbon materials. However, these methods have been developed specifically to perform lithography on the graphene, not on the material underneath the graphene. They also perform lithography on the same surface the BCP phase separation is performed on.

In contrast, our method extends this functionality by 1) preparing phase-separated block copolymers on transferrable hydrogenated graphene, 2) transferring these block copolymers to a new substrate with retention of the phase-separated patterns, and 3) using these block copolymer patterns to lithographically etch the new substrate underneath the graphene.

Finally, BCP lift-off has been mentioned, but in that context, the block copolymers are used as shadow masks for additive patterning of metal nanodots. After processing, the BCP is then lifted off the surface to reveal a substrate with metal patterns that have been added to it.

In contrast, our use of lift-off differs in two key ways: 1) our BCP phase separation is performed on a different substrate from the target substrate, whereas theirs is performed on the same substrate, and 2) our lift-off refers to lifting the patterned BCP/graphene off the starting substrate for transfer to the second, target, substrate, whereas their lift-off refers to removal of the BCP from the target substrate at the end of the patterning process.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What we claim is:

1. A method of graphene-enabled block copolymer lithography transfer to an arbitrary substrate, comprising the steps of:

applying graphene on a surface;
chemically-modifying the graphene;
adding block copolymers to the graphene on the surface;
phase-separating the block copolymers;
forming nanopatterned phase separated block copolymers;
delaminating the graphene; and
transferring the graphene and nanopatterned phase separated block copolymers to a second surface;
wherein the step of transferring the graphene maintains the nanopatterned phase separation of the block copolymers;
wherein the second surface does not undergo surface chemical preparation; and
wherein the step of delaminating the graphene is via water lift-off.

2. The method of graphene-enabled block copolymer lithography transfer to an arbitrary substrate of claim 1, wherein the nanopatterned phase separated block copolymers are a shadow mask for lithography on the second surface.

* * * * *